United States Patent [19]
Young et al.

[11] Patent Number: 5,936,424
[45] Date of Patent: Aug. 10, 1999

[54] HIGH SPEED BUS WITH TREE STRUCTURE FOR SELECTING BUS DRIVER

[75] Inventors: Steven P. Young, San Jose; Kamal Chaudhary, Milpitas; Shekhar Bapat, Santa Clara; Sridhar Krishnamurthy; Philip D. Costello, both of San Jose, all of Calif.

[73] Assignee: Xilinx, Inc., San Jose, Calif.

[21] Appl. No.: 08/950,380

[22] Filed: Oct. 14, 1997

Related U.S. Application Data

[63] Continuation-in-part of application No. 08/595,676, Feb. 2, 1996, Pat. No. 5,677,638, and a continuation-in-part of application No. 08/729,065, Oct. 10, 1996, Pat. No. 5,847,580.

[51] Int. Cl.$^6$ .................... H03K 19/0185; H03K 19/177
[52] U.S. Cl. .................................... 326/39; 326/86
[58] Field of Search ............................ 326/39, 83, 86, 326/41, 49

[56] References Cited

U.S. PATENT DOCUMENTS

| | | |
|---|---|---|
| Re. 34,363 | 8/1993 | Freeman . |
| 5,001,368 | 3/1991 | Cliff et al. .................................. 326/40 |
| 5,185,706 | 2/1993 | Agrawal et al. ......................... 364/489 |
| 5,231,588 | 7/1993 | Agrawal et al. .......................... 326/41 |
| 5,317,209 | 5/1994 | Garverick et al. ....................... 307/465 |
| 5,376,844 | 12/1994 | Pedersen et al. ........................ 326/39 |
| 5,504,440 | 4/1996 | Sasaki ....................................... 326/39 |
| 5,506,517 | 4/1996 | Tsue et al. ................................ 326/39 |
| 5,600,264 | 2/1997 | Duong et al. ............................. 326/39 |
| 5,635,851 | 6/1997 | Tavana ...................................... 326/86 |
| 5,646,546 | 7/1997 | Bertolet et al. ........................... 326/39 |
| 5,773,994 | 6/1998 | Jones ......................................... 326/41 |
| 5,834,949 | 11/1998 | Oba .......................................... 326/86 |
| 5,847,577 | 12/1998 | Trimberger ............................... 326/38 |
| 5,872,463 | 2/1999 | Pedersen .................................. 326/41 |

OTHER PUBLICATIONS

"The Programmable Logic Data Book", 1994, available from Xilinx, Inc., 2100 Logic Drive, San Jose, CA 95124, pp. 2–16 through 2–24.

"The XC5200 Logic Cell Array Family Technical Data", Oct. 1995, available from Xilinx, Inc., 2100 Logic Drive, San Jose, CA 95124, pp. 1 through 20.

"The Programmable Logic Data Book", 1996, published by Xilinx Inc., 2100 Logic Drive, San Jose, CA, 95124, pp. 4–1 to 4–49.

*Primary Examiner*—Michael Tokar
*Assistant Examiner*—Richard Roseen
*Attorney, Agent, or Firm*—Edel M. Young

[57] ABSTRACT

According to the invention, a structure is provided for driving a bus line that is both fast and small. Instead of a plurality of tristate buffers, one for each input signal, a plurality of multiplexers or gates is connected into a tree structure. The tristate enable line of the tristate buffer becomes the control line for enabling the tree structure to place its own input signal onto the bus instead of propagating the signal already on the bus. A buffer element then allows the resulting signal to be tapped from the bus. One embodiment of the invention includes lookahead logic similar to a lookahead carry chain. This allows large numbers of input lines to be connected to a bus line while retaining high speed. The symmetrical delay of a tree structure minimizes the greatest delay and thus increases predicted speed.

13 Claims, 19 Drawing Sheets

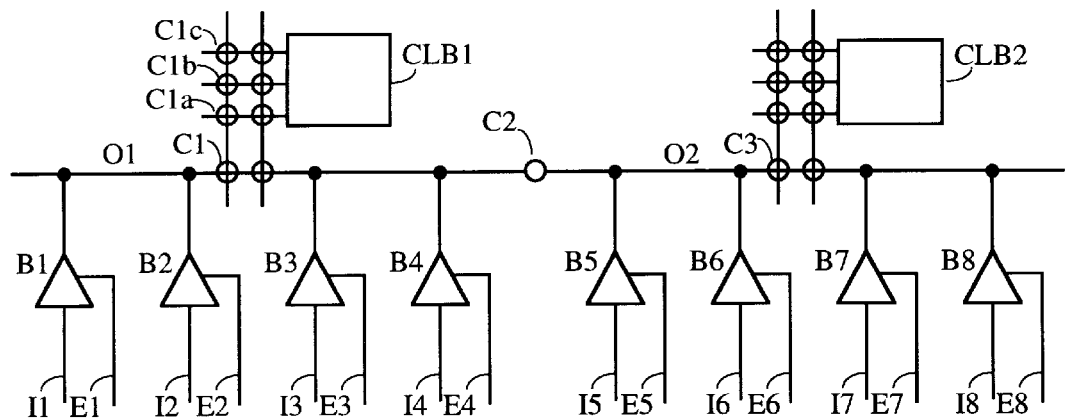
FIG. 1
Prior Art
● = Permanent Connection
○ = Programmable Connection, Not Connected
● = Programmable Connection, Connected
FIG. 2
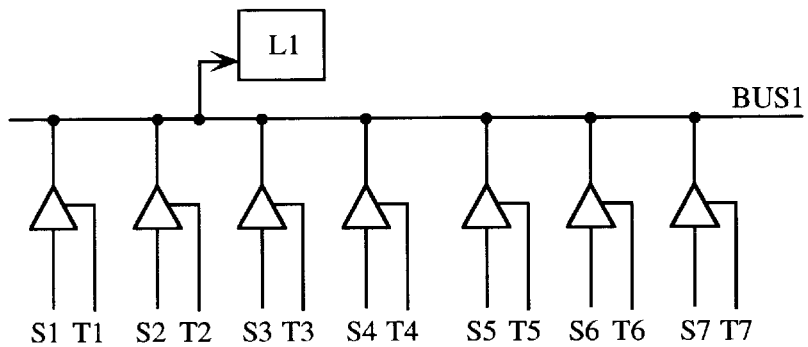
FIG. 3
Prior Art
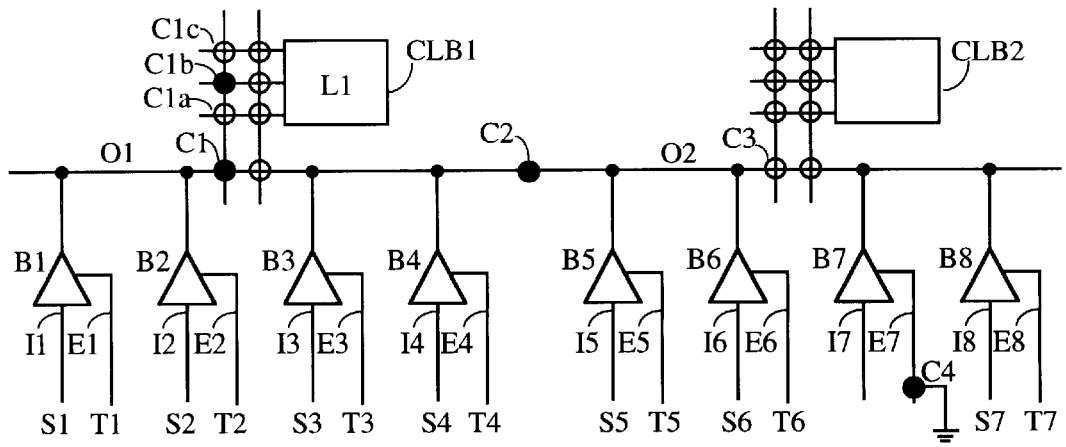
FIG. 4
Prior Art

HIGH SPEED BUS WITH TREE STRUCTURE FOR SELECTING BUS DRIVER

CONTINUATION INFORMATION

This application is a continuation-in-part of the following pending applications:

(1) Ser. No. 08/595,676 filed Feb. 2, 1996 by Young and Chaudhary entitled "High Speed Tristate Bus with Multiplexers for Selecting Bus Driver", to be issued Oct. 14, 1997 as U.S. Pat. No. 5,677,638; and (2) Ser. No. 08/729,065 filed Oct. 10, 1996 by Bapat and Krishnamurthy entitled "High Speed Bidirectional Bus with Multiplexers" now U.S. Pat. No. 5,847,580.

FIELD OF THE INVENTION

The invention relates to programmable integrated circuit devices, particularly FPGAs, and to controlling input signals for driving a bus.

BACKGROUND OF THE INVENTION

The overall structure of an FPGA is described by Freeman in U.S. Patent Re34,363. An FPGA includes configurable logic blocks and a configurable interconnect structure for connecting the logic blocks and otherwise routing signals through the FPGA. An FPGA may be configured to perform a particular function by turning on and off particular transistors in the FPGA to select functions performed by the logic blocks of the FPGA and to connect the logic blocks to each other through interconnect lines. One FPGA architecture with which the present invention will work is described by Tavana et al in U.S. patent application Ser. No. 08/222,138 [M-2257-1N] entitled FPGA Architecture with Repeatable Tiles Including Routing Matrices and Logic Matrices. The subject matter of this patent application is incorporated herein by reference.

It is common to use a single bus line for alternatively providing one of several signals to a circuit element. When a bus line is used, a control system must assure that only one driver uses the bus at one time. (A bus line may alternatively be used to provide a signal from a single source, or may be used to generate a wired-AND function by connecting a pull-up resistor and many pull-down signal sources of which none or many may be connected simultaneously.) FPGA integrated circuit chips having a tristate buffer structure for alternately placing multiple signals onto one bus line are available in the XC4000 and XC5200 families of devices available from Xilinx, Inc., assignee of the present invention. The tristate buffer feature of the Xilinx XC4000 family of products is described in the Xilinx 1994 Data Book at pages 2-16 and 2-24. The XC5200 family is illustrated in the XC5200 Logic Cell Array Family Technical Data published October 1995, pages 1–20. The tristate buffer is illustrated at pages 5 and 11.

In the Xilinx XC4000 and XC5200 families of FPGA devices, certain of the interconnect lines can serve as bus lines. Output terminals of several tristate buffers are connected to these lines and a control structure is present in the FPGA for selecting which tristate buffer places its signal onto the interconnect line.

FIG. 1 shows a tristate buffer structure including two line segments O1 and O2 which may or may not be connected together using programmable connector C2 to form a single bus line, and eight tristate buffers B1 through B8 for alternatively driving the line segments. Each buffer B1 through B8 typically receives an input signal from a different configurable logic block of the FPGA. (These configurable logic blocks are not shown in FIG. 1.) The bus line segments O1 and O2 can also be connected to terminals of configurable logic blocks via local interconnect line segments. FIG. 1 shows two configurable logic blocks, CLB1 and CLB2, which can be programmably connected to line segments O1 and O2 respectively. Programmable connectors such as C1, C1a, C1b, C1c, and C3 make these connections. Also, programmable connector C2 connects line segments O1 and O2 together. A control system, not shown, places an enable signal (may be active high or active low) on a selected tristate enable line E1 through E8 and thereby connects the selected input line I1 through I8 to its corresponding bus line segment O1 or O2. If programmable connector C2 is not connecting segments O1 and O2 together, each segment may receive its own driving signal.

FIG. 2 shows symbols used in the drawings, including a small black dot to indicate a permanent connection, a white circle to indicate a programmable connection not connected, and a black circle to indicate a programmable connection that is connected.

FIG. 3 shows part of a logic design which a user may wish to implement in an FPGA. In this example, the design has seven signals S1 through S7 to be alternatively placed onto a bus BUS1, which provides an input signal to a logic unit L1. Software is available to receive a user's design, including a structure such as illustrated in FIG. 3, and to select components of an FPGA which will implement each portion of the design. This software typically partitions the user's design into portions which will be implemented in a CLB and its related tristate buffers (called partitioning or mapping), then selects particular CLBs and tristate buffers to implement each portion (called placement), and finally selects interconnect lines to connect the pieces together according to the user's design (called routing). Sometimes, because of other logic not shown in FIG. 3, the placement step may choose to skip a tristate buffer when placing the logic for generating signals S1 through S7.

FIG. 4 shows an example implementation of the user's design of FIG. 3 in the FPGA structure of FIG. 1. In order to alternatively connect seven signal lines to the same bus, segments O1 and O2 are connected together by turning on connector C2. The user's logic represented in FIG. 3 by L1 is implemented in FIG. 4 by CLB1. Thus connectors C1 and C1b are turned on to connect segment O1 to CLB1. Connector C3 is not turned on, since CLB2 is not used to implement the design of FIG. 3. Because of placement and possible other considerations, the signal S7 of FIG. 3 will be generated in a non-contiguous logic block and placed onto signal line I8. Thus, buffer B7 is disabled by connecting enable line E7 to ground through connector C4. During operation, the control structure (not shown) places a high signal onto one of E1 through E6 and E8 to turn on one of the corresponding buffers B1 through B6 and B8. The selected signal S1 through S7 placed on line I1 through I6 and I8 is then provided to CLB1.

The structure of FIGS. 1 and 4 requires that each of buffers B1 through B8 be of sufficient size to drive any other circuit elements that may be connected to bus lines O1 and O2. If many input signals may be buffered onto the bus and many circuit elements may be driven by the bus, the size of the structure of FIG. 1 can be undesirably large or else the speed of signal propagation can be undesirably slow.

SUMMARY OF THE INVENTION

According to the invention, a structure is provided for driving a bus line that is both fast and small. In one embodiment, instead of a plurality of tristate buffers, one for each input signal, a plurality of multiplexers is connected into a chain. The tristate enable line of the tristate buffer becomes the control line for enabling the multiplexer to place its own input signal into the chain instead of propagating the signal already in the chain. A buffer element then drives the resulting signal onto an output line of the chain.

One embodiment of the invention includes lookahead logic similar to a lookahead carry chain. This allows large numbers of input lines to be connected to a bus line while retaining high speed. An embodiment implements the lookahead feature using AND gates and OR gates and thereby further increases speed and reduces size.

In accordance with another aspect of the present invention, the output signal of a multiplexer chain is provided to two logic gates which in turn propagate their respective output signals in opposite directions, thereby providing bidirectional signal distribution. In the present invention, each of the two logic gates forms part of a logic gate chain. In this manner, multiple multiplexer chains interconnected via the two logic gate chains implement a flexible, high-speed bus with multiple drivers. In one embodiment, two OR chains propagate signals in opposite directions. In another embodiment, two AND chains propagate the signals in the two directions. One AND chain combines the output of all the multiplexer chains to its left. The other AND chain combines the output of all the multiplexer chains to its right. Thus, the output of the entire bus is provided at both the leftmost and the rightmost end of the AND chain. The bus output is also made available at intermediate points, referred to as tap points, by combining the outputs of the two logic gate chains using a logic gate. One logic gate chain provides the outputs of all drivers to the left of the tap point while the other logic gate chain provides the outputs of all drivers to the right of the tap point. In one embodiment, tap points are provided for every four drivers, thereby significantly reducing routing inefficiencies.

In accordance with another aspect of the invention, groups of drivers are connected through a tree structure to the two driver chains and to the tap points, thus minimizing delay.

In one embodiment, the chains can be broken periodically into segments under control of a memory cell controlled by the FPGA designer, and a tap point is provided for each segment.

The present invention allows large number of drivers to drive a bus line at high speed. At the same time, the present invention can be partitioned to implement multiple buses, each bus being driven by a selected number of drivers. Further, the present invention does not constrain the drivers to be placed along a row (or a column), thereby providing significant flexibility for the partitioning, placing, and routing software.

BRIEF DESCRIPTION OF THE DRAWINGS

FIG. 1 shows a prior art tristate buffer structure for driving a bus.

FIG. 2 shows symbols used in the drawings.

FIG. 3 shows part of a logic design which a user may wish to implement in an FPGA.

FIG. 4 shows an example implementation of the user's design of FIG. 3 in the prior art FPGA structure of FIG. 1.

FIG. 8b shows another embodiment similar to FIG. 8a.

DETAILED DESCRIPTION OF THE DRAWINGS

Figure 5:
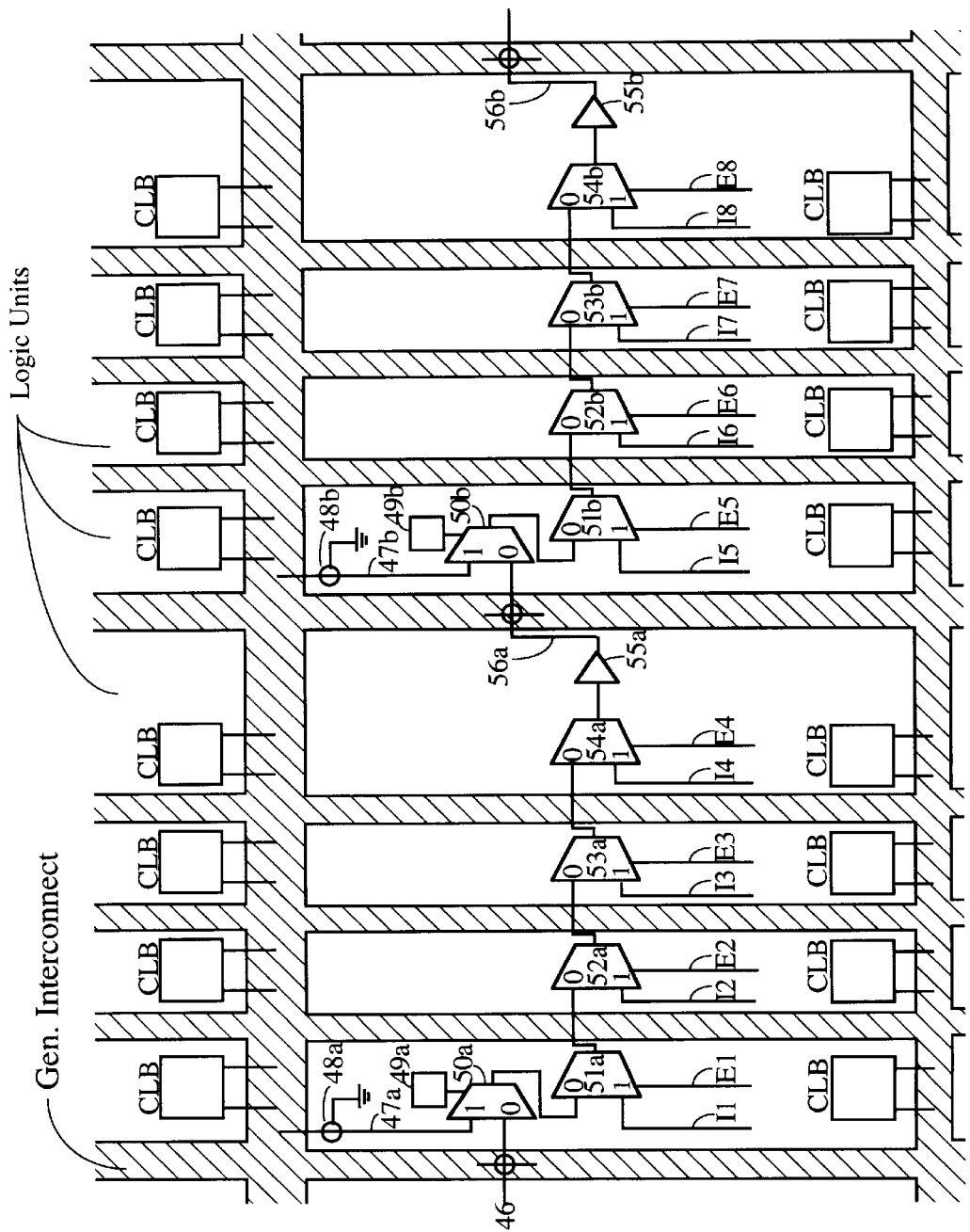
FIG. 5 shows a bus structure according to the invention.

FIG. 5 shows a bus structure according to the invention implemented within an FPGA structure. Shaded regions indicate the interconnect structure of the FPGA. In a commercial device, many more programmable connections than those shown are available. In order to avoid cluttering the drawing, only a minimum number have been shown. Illustrated between the interconnect regions are logic units in which are positioned configurable logic blocks labeled CLB. The bus structure makes use of both lines in the general interconnect and multiplexers in the logic units. A first multiplexer chain comprises multiplexers 50a–54a and buffer 55a. A second chain comprises multiplexers 50b–54b and buffer 55b. Multiplexer 50a can receive an input signal on line 46 from another chain to the left, not shown, or can receive a signal on line 47a from the general interconnect structure. For starting a chain, a ground signal can also be applied to line 47a. Multiplexer 50a is controlled by a memory cell 49a. A logic 1 in memory cell 49a causes the signal on line 47a to be forwarded to multiplexer 51a. A logic 0 in memory cell 49a causes the chain to continue from line 46. If no enable signal on line E1 through E4 is a logic 1, then the output signal from multiplexer 50a is forwarded to buffer 55a and placed onto bus line 56a. If any enable signal on line E1 through E4 is logic 1, then the signal on the corresponding multiplexer input line I1 through I4 is placed onto bus 56a. There should be only one logic 1 enable signal among all enable signals for driving one bus. If this is the case, then the multiplexer chain will forward the input signal associated with that logic 1 to the output bus. If, through a design error or other reason, more than one enable signal is high, there will be no signal contention, in contrast to the prior art tristate buffer structure. The rightmost signal will be applied to the output bus line 56a. No damage will be done to the chip by this action, in contrast to the prior art structure of tristate buffers.

In any sequence of chains comprising a bus line, the first chain will be initialized to logic 0, for example via connector 48a. Thus, if none of the enable signals E1 through E4 is high, the logic 0 will propagate through the chain and the output will be logic 0. The second chain can be connected to the first chain by placing logic 0 into memory cell 49b. This allows eight input signals to drive a single output bus line 56b. An actual FPGA will typically include many adjacent units with the same structure. Thus a very large number of input signals can be alternatively selected to drive one bus line. And many separate buses can be constructed from these adjacent units. Also, using input line 47 (47a, 47b, for example), allows an output signal on a bus line 56 (56a, 56b, for example) to be connected to a non-adjacent chain. Thus multiple non-adjacent chains can be joined to form one bus line.

Figure 6:
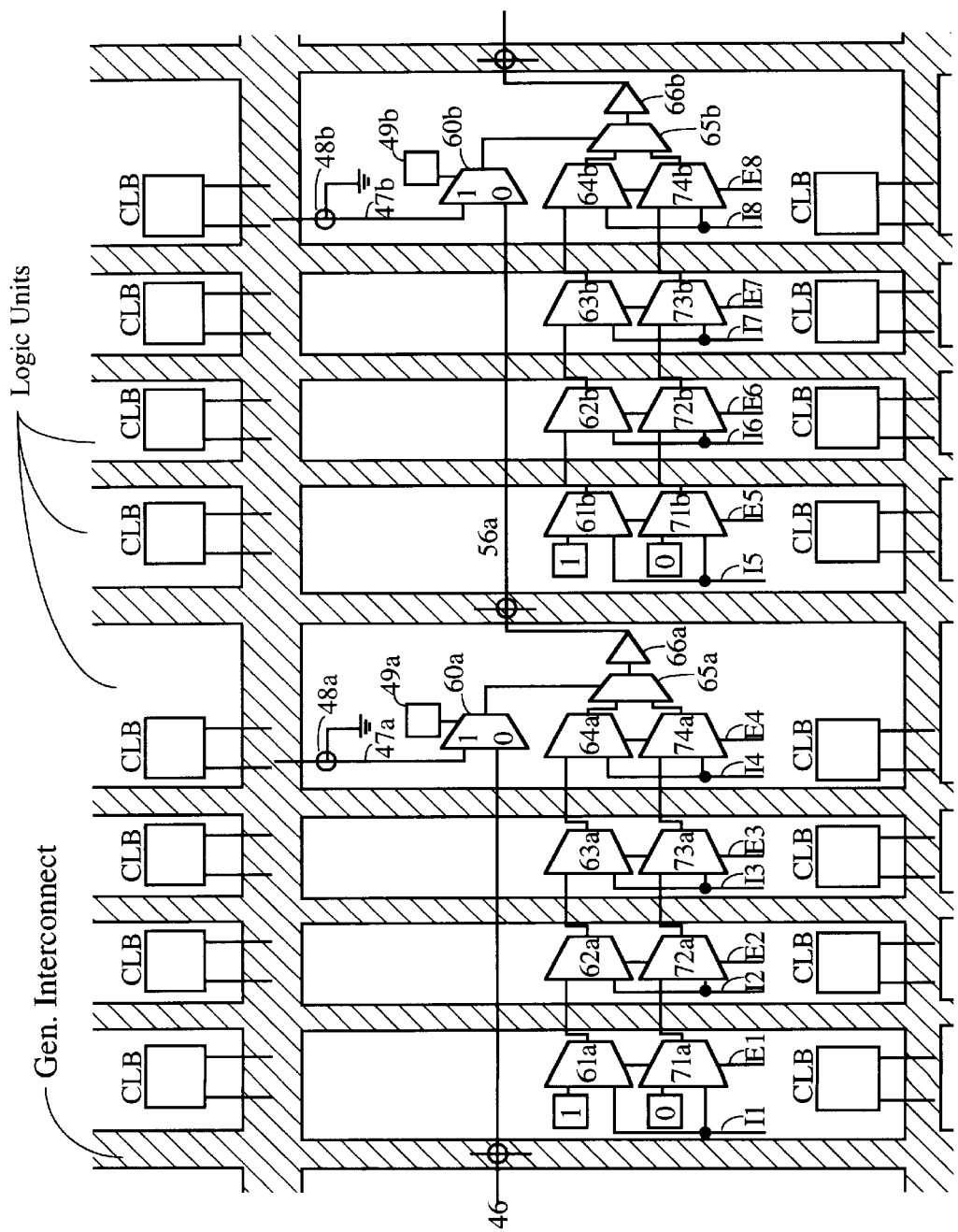
FIG. 6 shows a structure with a lookahead circuit for shortening the delay of the multiplexer chain.

With the structure of FIG. 5, the delay caused by a long chain of multiplexers may be undesirably large. FIG. 6 shows an FPGA with a lookahead structure for shortening the delay of the multiplexer chain. Two parallel chains of multiplexers 61–64 and 71–74 receive leading 1 and 0 respectively and provide their respective output signals to the multiplexer to the right, eventually to multiplexer 65. If the output of multiplexer 60a is 1, the chain with the leading 1 (1-chain) is selected, that is, the output of multiplexer 64 is selected by multiplexer 65. If the output of multiplexer 60a is 0, the 0-chain is selected, that is, the output of multiplexer 74 is selected. The structure of FIG. 6 allows the output of multiplexer 60 to control multiplexer 65 without encountering the signal path delay of FIG. 5.

Figure 7:
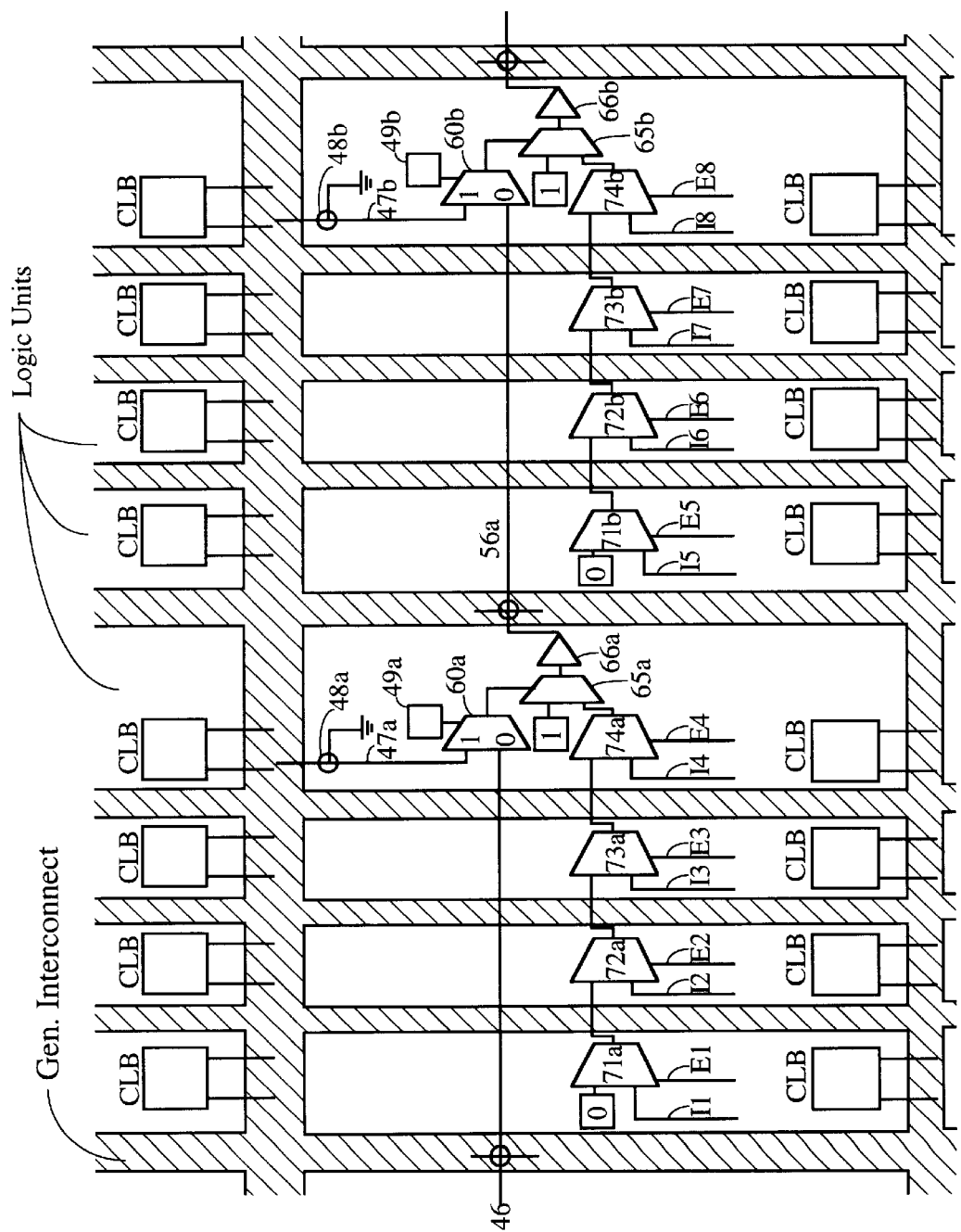
FIG. 7 shows how the circuit of FIG. 6 can be simplified without any loss of function.

FIG. 7 shows how the circuit of FIG. 6 can be simplified without any loss of function. In FIG. 6, if any of signals I1 through I4 is to be placed onto the bus, its enable line E1 through E4 will be high. The functionality of a tristate bus line requires that the design cause all other enable signals to be inactive, and thus the logic 0 which initiated the chain is propagated to multiplexer 60a. Thus, the output from multiplexer 60a should be logic 0, causing the 0-chain to be selected by multiplexer 65a. Only if a logic 1 is being propagated from the left will multiplexer 60a cause multiplexer 65a to select the 1-chain. And when the 1-chain is selected, this means that a multiplexer to the left was enabled and its input signal was logic 1. This requires that all enable signals E1 through E4 be inactive. So whenever the 1-chain is selected, the constant logic 1 input signal will propagate to multiplexer 65a. Thus the 1-chain is not needed. In FIG. 7, the 1-chain comprising multiplexers 61a–64a is eliminated and the memory cell initiating the 1-chain becomes a direct input to multiplexer 65a.

Memory cells can be used to load the 0 or 1 into the input of multiplexer 71a and multiplexer 65a, and therefore these structures are programmable. Thus, the structure illustrated in FIG. 7 can be used for other functions than a tristate buffer, in particular to generate AND and OR functions, by loading different values into the inputs of multiplexers 71a and 65a.

Figure 8A:
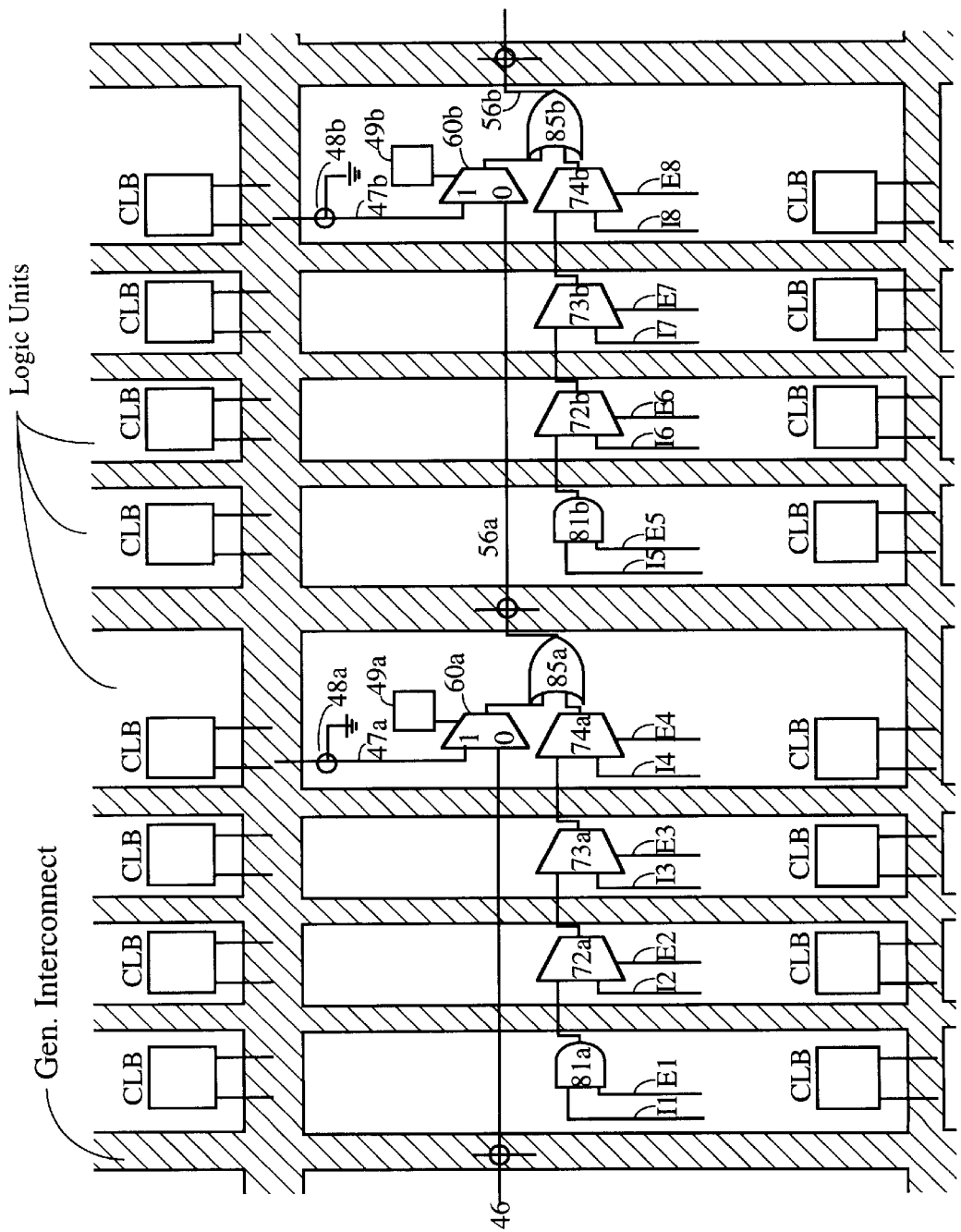
FIG. 8a shows a further simplification from FIG. 7.

FIG. 8a shows a further simplification from FIG. 7. A multiplexer with a constant 0 input can be replaced by an AND gate. Thus AND gate 81a of FIG. 8a replaces multiplexer 71a and the leading 0 memory cell of FIG. 7. A multiplexer with a constant 1 input can be replaced by an OR gate. Thus multiplexer 65a and the logic 1 memory cell are replaced by OR gate 85a. Because an OR gate provides a buffered output signal, buffer 66a of FIG. 7 can also be eliminated. A signal starting to the left of line 46 and propagating to a point to the right of bus line 56b is delayed only by the pass transistor in multiplexer 60a, the drive transistor in OR gate 85a, the pass transistor in multiplexer 60b and the drive transistor in OR gate 85b. Thus the path is faster than that of FIG. 5.

Figure 8B:
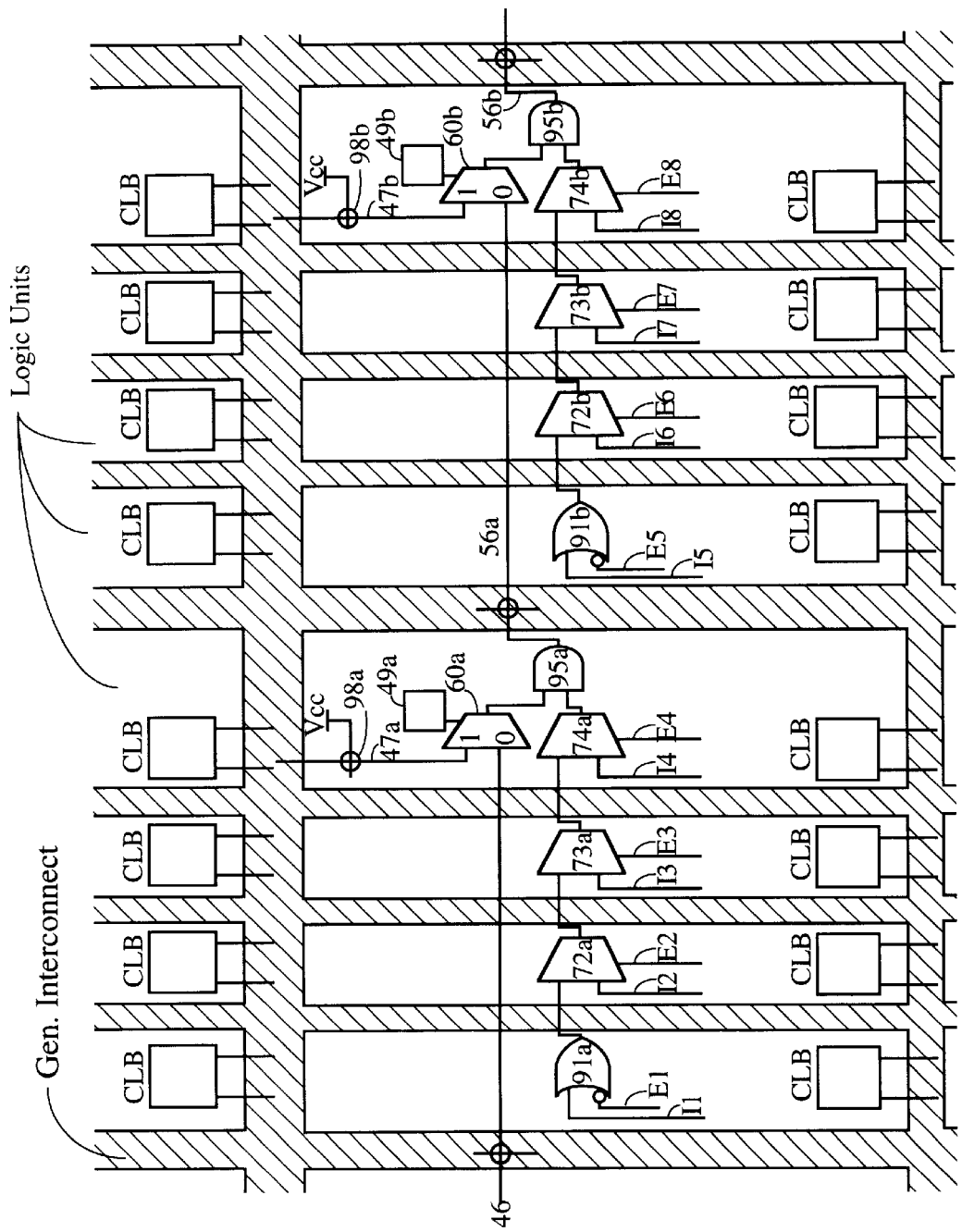

An alternative embodiment is shown in FIG. 8b. AND gate 81 of FIG. 8a at the beginning of a chain and OR gate 85 at the end of a chain is replaced in FIG. 8b by OR gate 91a with an inverted enable input at the beginning of the chain and AND gate 95a at the end of the chain. Related to this, the ground signal at connector 48a of FIG. 8a is replaced by a Vcc signal at connector 98a in order to cause AND gate 95a to pass the multiplexer chain signal.

The present invention can programmably provide either a pull down function (described in reference to FIG. 8a) or a pull-up function (described in reference to FIG. 8b). The embodiment of FIG. 8a provides a pull down function because if no drivers are driving, then the output signal is a logic zero by default. The embodiment of FIG. 8b provides a pull up function because if no drivers are driving, then the output signal is a logic one by default. AND gate 81a, OR gate 85a, and the ground provided to programmable connector 48a (FIG. 8a) are replaced by OR gate 91a, AND gate 95a, and a voltage supply Vcc.

Figure 9:
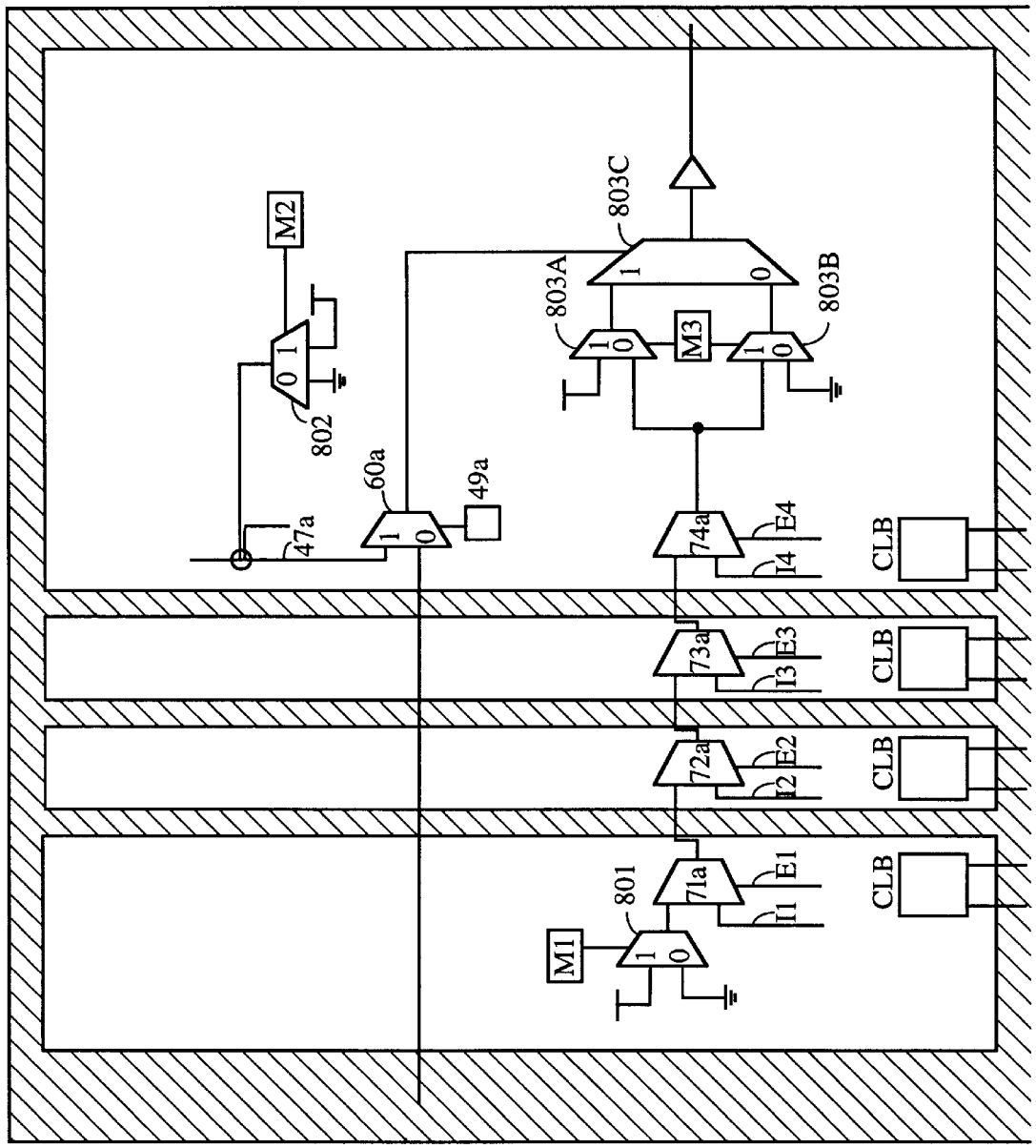
FIG. 9 illustrates a plurality of programmable structures with pull-up and pull-down flexibility of the multiplexer chain.

FIG. 9 allows either a pull down function or a pull up function. To implement this feature, the structure of FIG. 7 is amended. The constant zero memory cell associated with multiplexer 71a, the connection to ground associated with connector 48a, and multiplexer 65a and its associated logic 1 memory cell of FIG. 7 are replaced in FIG. 9 with multiplexers 801, 802, and 803A–803C, respectively. Multiplexers 801, 802, and 803A–803B are controlled by memory cells M1, M2, and M3, respectively. Table 1 below indicates that depending on the states of memory cells M1, M2, and M3, either a pull down function or a pull up function is provided.

TABLE 1

| Function | M1 | M2 | M3 |
| --- | --- | --- | --- |
| pull down | 0 | 0 | 1 |
| pull up | 1 | 1 | 0 |

Specifically, if memory cell M3 stores a logic one, then multiplexer 803C has a constant 1 input signal, thereby implementing an OR gate (described in reference to FIG. 7). On the other hand, is memory cell M3 stores a logic zero, then multiplexer 803C has a constant 0 input signal, thereby implementing an AND gate. As noted in Table 1, memory cells M1 and M2 always store the same logic state and, thus, in one embodiment comprise the same memory cell. As further noted in Table 1, memory cell M3 always stores the opposite logic state of memory cells M1 and M2. Therefore, in yet another embodiment, only one memory cell is provided, wherein a non-inverted signal is provided to multiplexers 801 and 802 and an inverted signal is provided to multiplexers 803A and 803B.

The present invention also programmably provides a wide OR or a wide AND function. For example, assuming that memory cells M1 and M2 are storing a logic zero and memory cell M3 is storing a logic one, if all input signals on input lines I1–I4 are tied to voltage Vcc (logic one), then multiplexers 71a–74a provide a wide OR function having input signals on lines E1–E4. On the other hand, assuming that memory cells M1 and M2 are storing a logic one and memory cell M3 is storing a logic zero, if all input signals on input lines 11–14 are tied to ground (logic zero), then multiplexers 71a–74a provide a wide AND function.

As noted previously, the signals on input lines 11–14 may be provided by CLBs in the device, wherein the CLBs themselves may be implementing logic functions (i.e. OR gates or AND gates). Therefore, in one embodiment in which the input signals are provided by the CLBs, the present invention provides even wider OR gates or wider AND gates.

FIGS. 10–14 show examples of how the structure of FIG. 8a can implement some designs.

Figure 10:
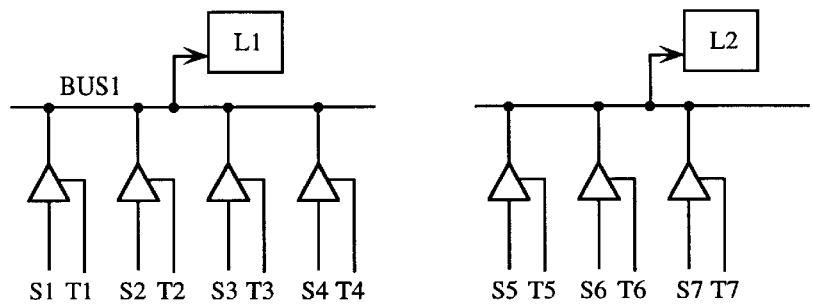
FIG. 10 represents part of a user's design.

FIG. 10 represents part of a user's design, namely two logic devices, L1 and L2, each of which can alternately receive one of several input signals. Logic device L1 is to receive one of input signals S1 through S4 and logic device L2 is to receive one of input signals S5 through S7. The user has indicated that the signal for logic device L1 will be placed onto bus BUS1 and the signal for logic device L2 will be placed onto bus BUS2. Selection of signals S1 through S7 is to be controlled by tristate control signals T1 through T7, respectively.

Figure 11:
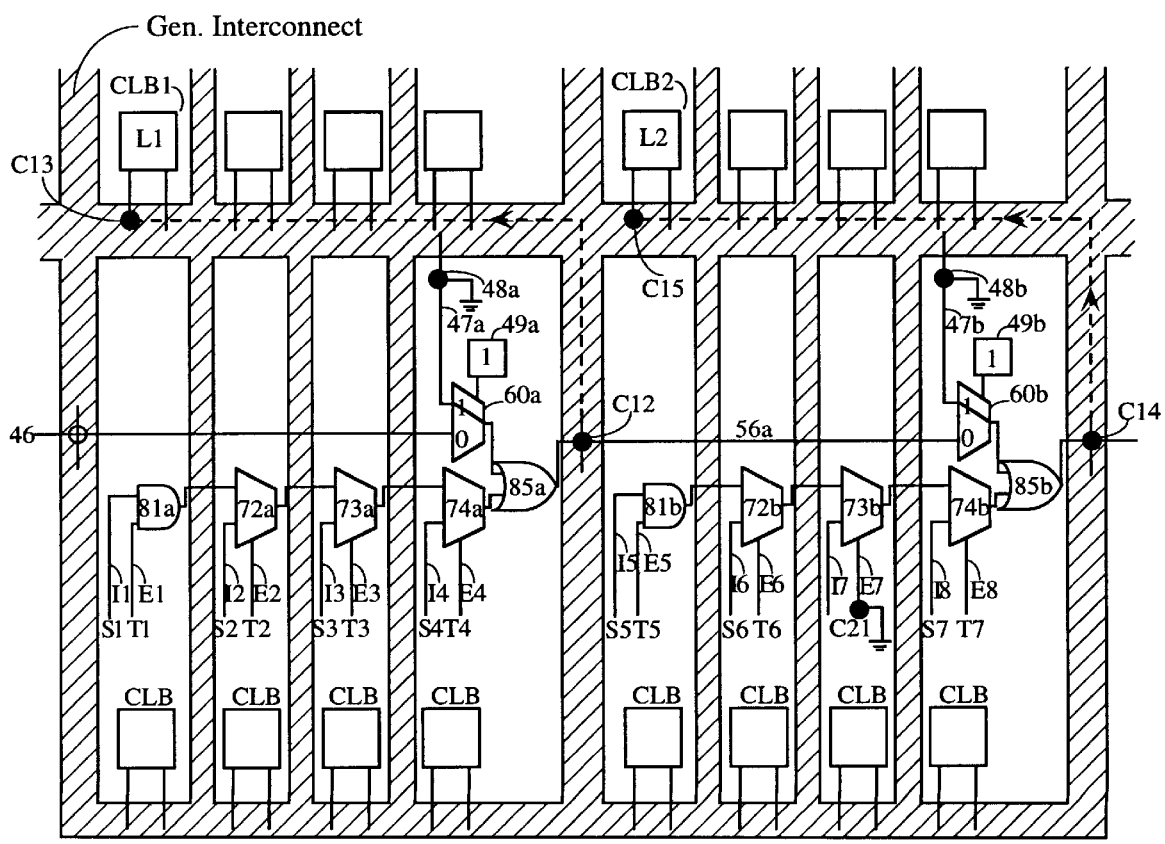
FIG. 11 shows how the structure of FIG. 8a will implement the design of FIG. 10.

FIG. 11 shows how the structure of FIG. 8a will implement the design of FIG. 10. Memory cell 49a is loaded with a logic 1 and a ground signal is applied to line 47a through connector 48a. This causes multiplexer 60a to forward the ground signal to OR gate 85a and thus causes OR gate 85a to respond to the multiplexer chain comprising AND gate 81a and multiplexers 72a through 74a. Bus line 56a is connected to the general interconnect structure at connector C12. Interconnections not shown form the path illustrated in dashed lines from connector C12 to connector C13. Connector C13 connects the interconnect structure to configurable logic block CLB1, which is configured to implement logic L1. Signals S1 through S4 are applied to lines I1 through I4 and tristate control signals T1 through T4 are applied to enable lines E1 through E4. This implements the left portion of FIG. 10.

To implement the right portion of FIG. 10, a logic 1 is loaded into memory cell 49b so that bus line 56a will not be connected to OR gate 85b. A ground signal is applied through connector 48b and multiplexer 60b to OR gate 85b so that OR gate 85b will respond to the multiplexer chain comprising AND gate 81b and multiplexers 72b, 73b, and 74b. A ground signal is applied to enable line E7 of multiplexer 73b through connector C21 so that input line I7 will be ignored and the signal from multiplexer 72b will be passed to multiplexer 74b. (This assumes the software has decided that the logic illustrated in FIG. 10 fits better with the total logic placement when multiplexer 73b is skipped.) Connections are made at C14 and C15, thus applying the output of OR gate 85b to configurable logic block CLB2, which is programmed to implement logic L2. Signals S5 and S6 are applied to I5 and I6. Signal S7 is applied to input line I8. Tristate control signals T5 and T6 are applied to enable lines E5 and E6. Tristate control signal T7 is applied to enable line E8. Thus the configuration of FIG. 11 implements the logic design portions shown in FIG. 10.

Figure 12:
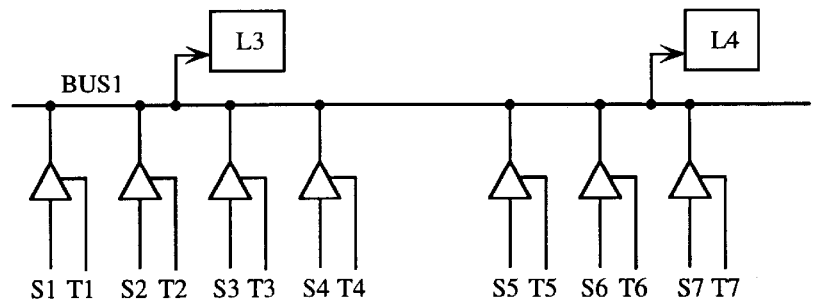
FIG. 12 illustrates part of another design.
Figure 13:
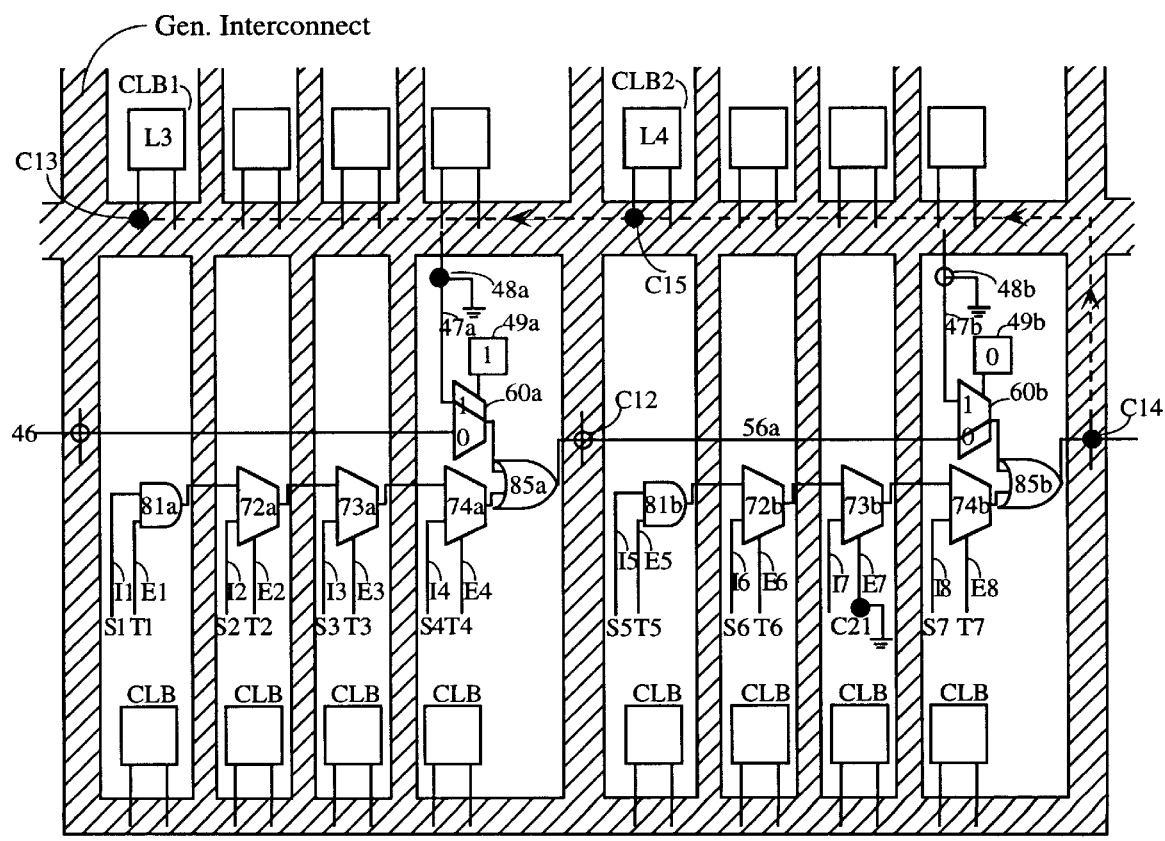
FIGS. 13 and 14 illustrate two ways the design portion of FIG. 12 can be implemented.
Figure 14:
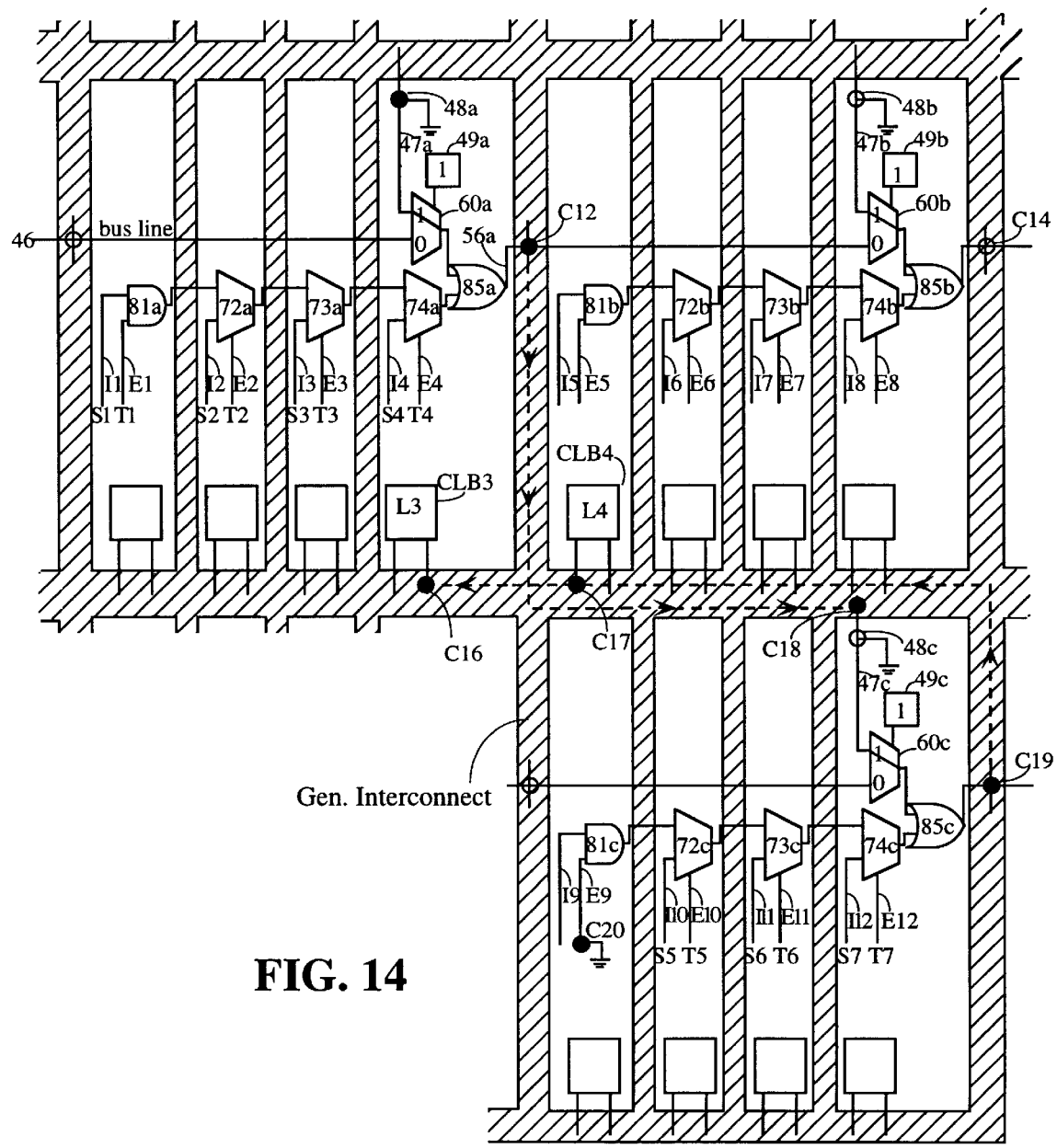

FIG. 12 illustrates part of another design. FIGS. 13 and 14 illustrate two ways this design portion can be implemented. The design of FIG. 12 selects from seven input signals S1 through S7, and provides the selected signal to both of logic elements L3 and L4.

In FIG. 13, connector C12 is not used to connect line 56a to the interconnect structure. The left portion of the structure is configured as in FIG. 11. On the right, memory cell 49b is loaded with a logic 0 so that the output signal from OR gate 85a is applied to OR gate 85b. As in FIG. 11, multiplexer 73b is bypassed. The output of OR gate 85b is applied to the interconnect structure by turning on connector C14. A path is formed through the interconnect structure and through connectors C13 and C15 to configurable logic blocks CLB1 and CLB2, which implement logic portions L3 and L4.

Note that OR gate 85b will provide a logic 1 output signal if any input signal S1 through S7 is high when the corresponding tristate enable signal T1 through T7 is high. Or gate 85b will provide a logic 0 output signal if an input signal S1 through S7 is low when the corresponding tristate enable signal T1 through T7 is high. If no enable signal is high, OR gate 85b will provide a logic 0 output signal.

FIG. 14 illustrates an alternative implementation of the same logic, and illustrates that the input signals for driving a bus need not be placed along the same line. Signals S1 through S4 are placed on lines I1 through I4, as before. However, signals S5 through S7 have been placed onto lines I10 through I12 in another row.

As before, connector C12 connects line 56a to the general interconnect. A path is found through the general interconnect from connector C12 to connector C18, to provide the output signal from OR gate 85a to line 47c, which is on another row and another column. Memory cell 49c is loaded with a logic 1 to forward the signal to OR gate 85c. Enable line E9 is connected to ground through connector C21, so input line I9 is ignored. Signals S5 through S7 are placed onto lines I10 through I12 and tristate control signals T5 through T7 are placed onto enable lines E10 through E12. Connector C19 places the output of OR gate 85c onto the general interconnect structure. Connectors C16 and C17 forward the signal from the general interconnect structure to CLB3 and CLB4. CLB3 will implement logic L3 and CLB4 will implement logic L4. As the signal travels through the interconnect structure it may be buffered as needed. Thus a bus line can be formed using general interconnect line segments in combination with the fast lines such as 56a for connecting adjacent segments. This increases the flexibility of the FPGA for placing large designs compactly into the FPGA.

It is clear from the above description that the present invention allows a bus line to be formed from a combination of interconnect lines which do not have to be in a particular relationship to each other. From the simple examples shown, one of ordinary skill in the art will understand how to implement many other designs in many arrangements. For example, in FIG. 8a, AND gate 81 at the beginning of a chain and OR gate 85 at the end of a chain can alternatively be implemented as an OR gate at the beginning and an AND gate at the end of a chain as shown in FIG. 8b. Also, even though the illustration groups input lines into sets of four, another number may be chosen.

Often, routing complications may occur because of the inherently directional multiplexer chains of FIGS. 5–14. For example, a signal that has traversed through all the logic units in a row of multiplexer chains can only be obtained at the logic unit at the rightmost end of that multiplexer chain. Thus, should that signal be needed at the left end of the chain, additional routing resources in the programmable interconnect would be required. Therefore, these multiplexer chains may generate significant routing inefficiencies and create undesirable timing delays as well as use up valuable programmable interconnect. Furthermore, the multiplexer chains of FIGS. 5–14 constrain the placer software to place all logic driven by the bus signal near the rightmost end of the multiplexer chain. Thus, a need arises for a bus structure which eliminates all of the above inefficiencies.

Figure 15:
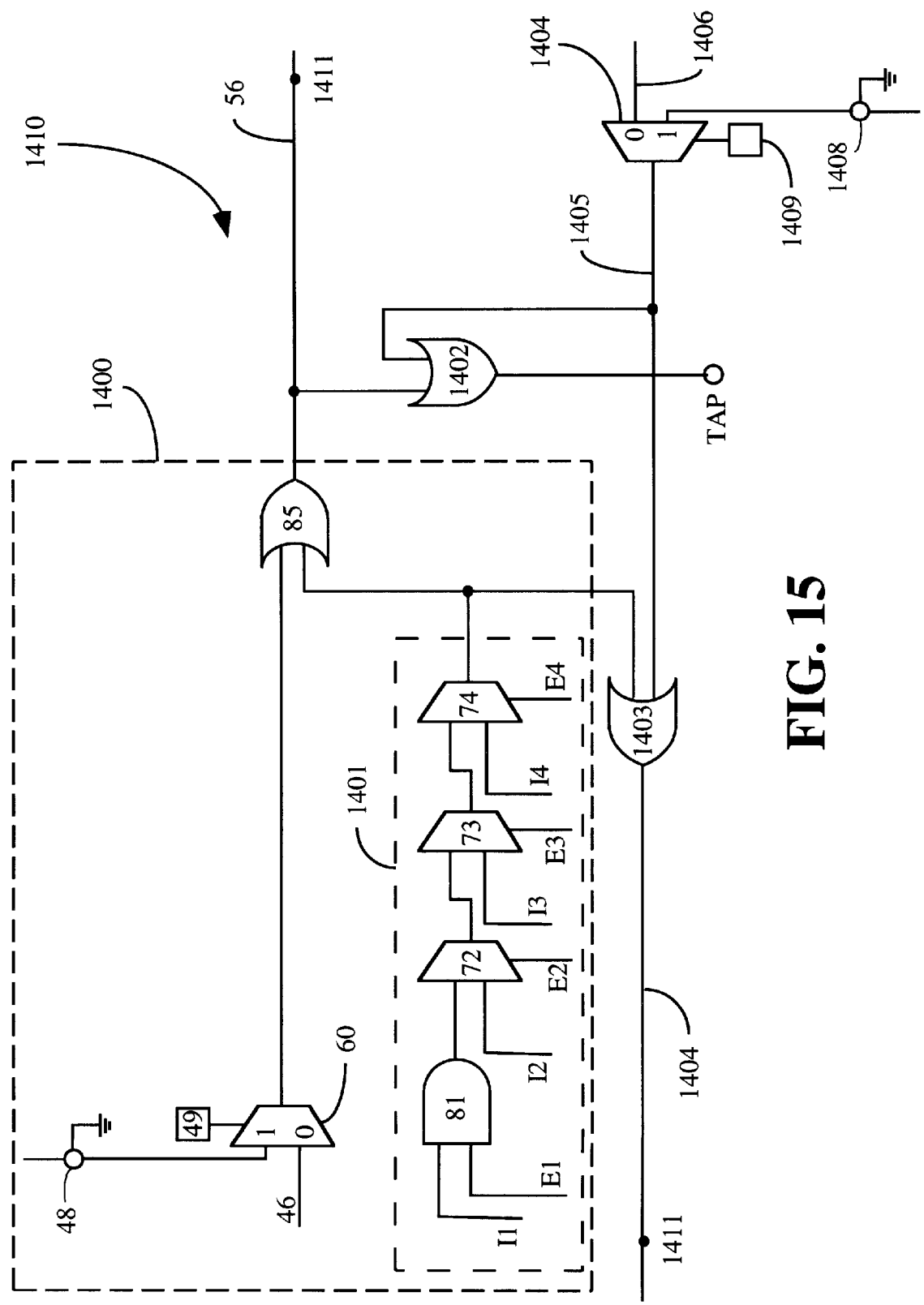
FIG. 15 shows a bidirectional multiplexer chain in accordance with the present invention.

FIG. 15 illustrates a bidirectional multiplexer chain 1410 which provides these advantages. In accordance with the present invention, bidirectional multiplexer chain 1410 duplicates the look-ahead feature of FIG. 8a in the opposite direction, thereby providing signal propagation in two directions. Birectional multiplexer chain 1410 includes the logic elements of a directional multiplexer chain previously described in reference to FIG. 8a (dashed box 1400). These elements include AND gate 81, multiplexers 60, 72, 73, 74, and OR gate 85. As shown in FIG. 15, the output signal of element set 1401 is provided to OR gate 85 as well as to OR gate 1403. However, the output signals of OR gates 85 and 1403 are propagated in opposite directions. Thus, the output signal of OR gate 85 is provided on line 56 which continues to the right, whereas the output signal of OR gate 1403 is provided on line 1404 which continues to the left. In this manner, bidirectional multiplexer chain 1410 ensures bidirectionality of the bus.

Furthermore, in this embodiment, the present invention advantageously provides a signal tap point for each bidirectional multiplexer chain. Specifically, OR gate 1402 provides the sum of the signals on lines 56 and 1405. In accordance with the present invention, a multiplexer 1404 provides its output signal to OR gate 1403 and to OR gate 1402. Thus, OR gate 1402 sums the output signal of the multiplexer chain to the left (in this case, multiplexer chain 1400) and the output signal of the multiplexer chain to the right (not shown).

Figure 16:
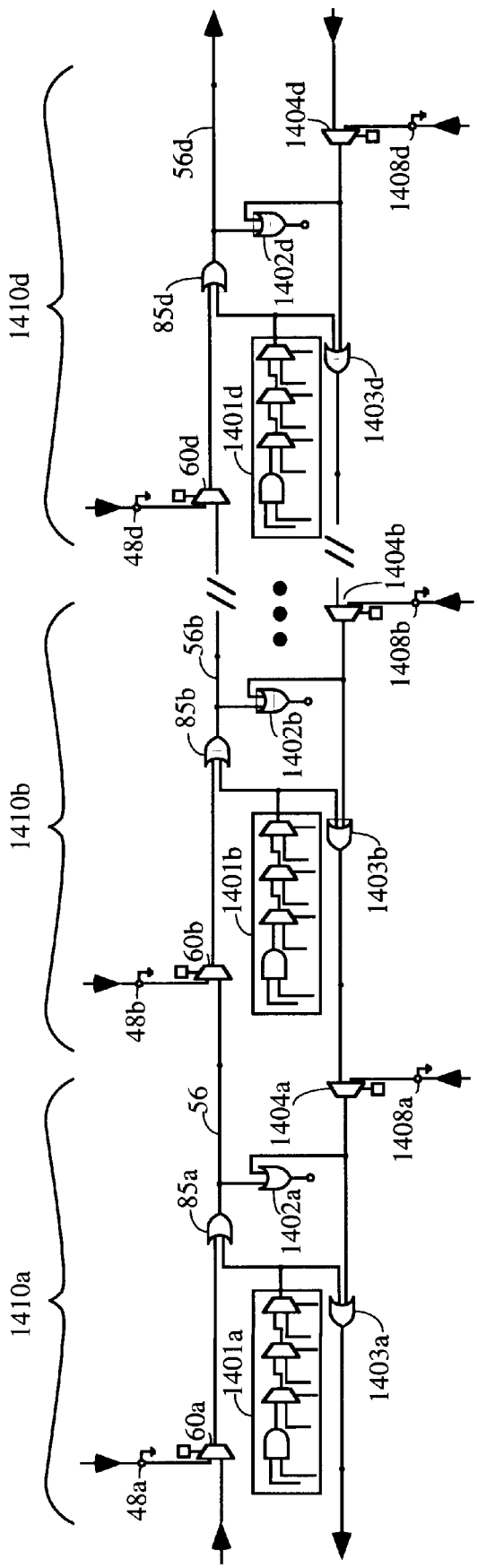
FIG. 16 illustrates a plurality of interconnected bidirectional multiplexer chains on the same row.

Therefore, if multiple bidirectional multiplexer chains 1410a–1410d are connected as shown in FIG. 16, the output signal of OR gate 1402a, for example, is identical to the signal which propagates through all bidirectional multiplexer chains and exits from the rightmost multiplexer chain, i.e. from OR gate 85d. Thus, should the output signal of OR gate 85d be needed anywhere along the length of the chain, the present embodiment provides that signal at various tap points along the length of the chain, thereby minimizing routing inefficiencies. In this manner, the present invention minimizes the need for additional programmable interconnect and eliminates the undesirable timing delays associated with directional multiplexer chains. Moreover, OR gates 85a–85d, 1402a–1402d, and 1403a–1403d include buffers (as described in detail in reference to OR gate 85a in FIG. 8a) and, therefore, repower the signal as it traverses the chain. In this manner, the present invention ensures that, irrespective of the additional loading, timing delay is minimized.

By using the programmable connectors and the programmable interconnect, the present invention provides additional routing flexibility such that bidirectional multiplexer chains 1410 need not be adjacent. Specifically, referring to FIG. 17, bidirectional multiplexer chain 1410A is coupled to bidirectional multiplexer chain 1410B which in turn is coupled to bidirectional multiplexer chain 1410C. In this case, bidirectional multiplexer chains 1410A and 1410C are located on a different row than bidirectional multiplexer chain 1410B. In accordance with this configuration, OR gate 1403B is coupled to an input terminal of multiplexer 1404A, OR gate 85A is coupled to an input terminal of multiplexer 60B, OR gate 85B is coupled to an input terminal of multiplexer 60C, and OR gate 1403C is coupled to an input terminal of multiplexer 1404B. In accordance with the present invention, bidirectional multiplexer chain 1410 can be located on any column or row and yet be interconnected to form a bus structure, thereby providing significant flexibility in placing a user's design on an FPGA. To ensure total flexibility, each bidirectional multiplexer chain 1410 includes a tap point 1402 and is interconnectable to other chains via programmable interconnect 1601 and programmable connectors 1411.

According to another aspect of the invention, signals from a group of possible bus drivers can be combined through a logical tree structure to form a signal for driving a bus. A tree structure has the advantage over a chain structure that all signals feeding the trunk of the tree pass through equal numbers of gates, therefore the maximum delay (for the slowest signal) is minimized.

Figure 18:
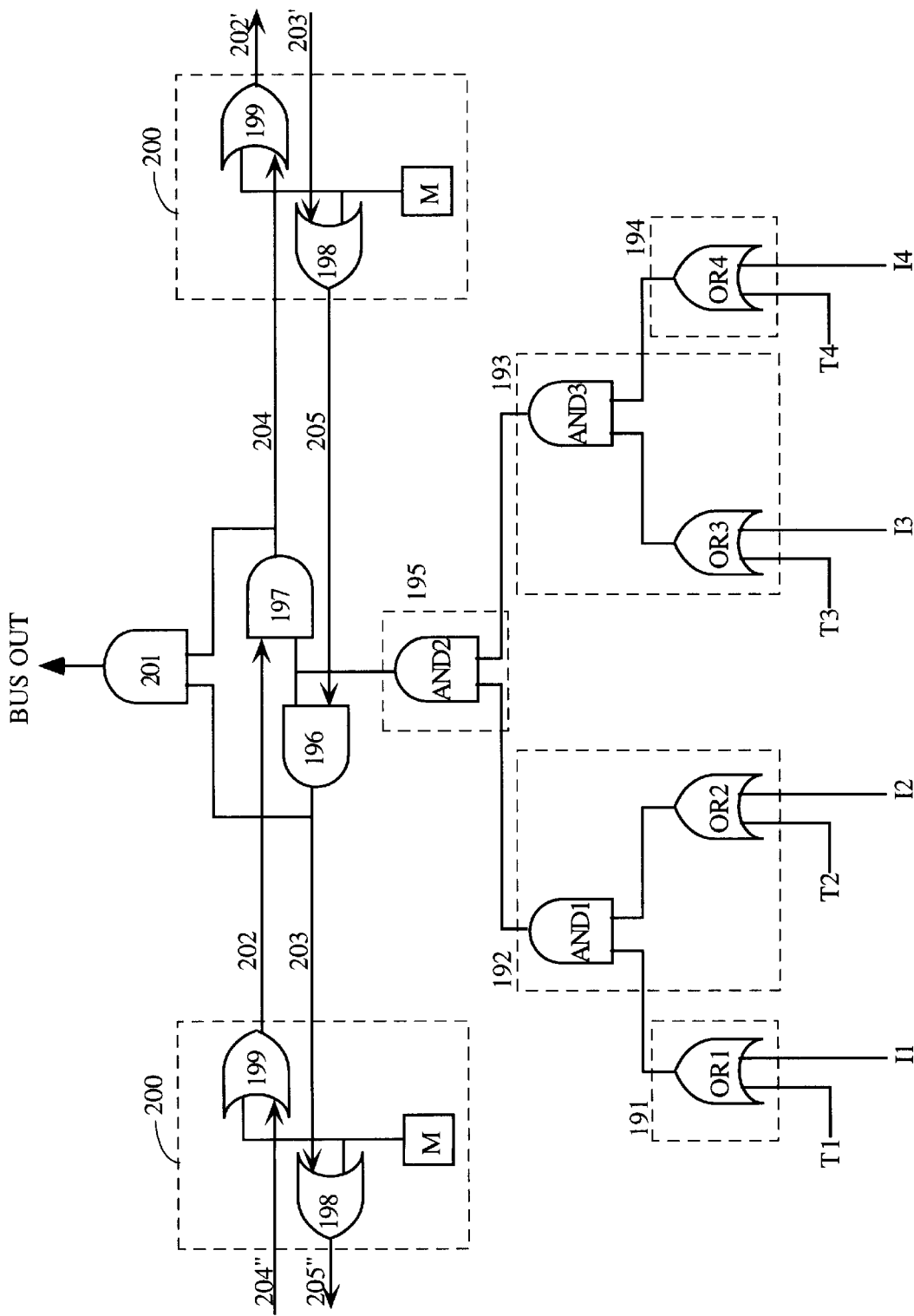
FIGS. 18 and 19 show two embodiments of a tree structure for combining signals for placing onto a bidirectional bus.
Figure 19:
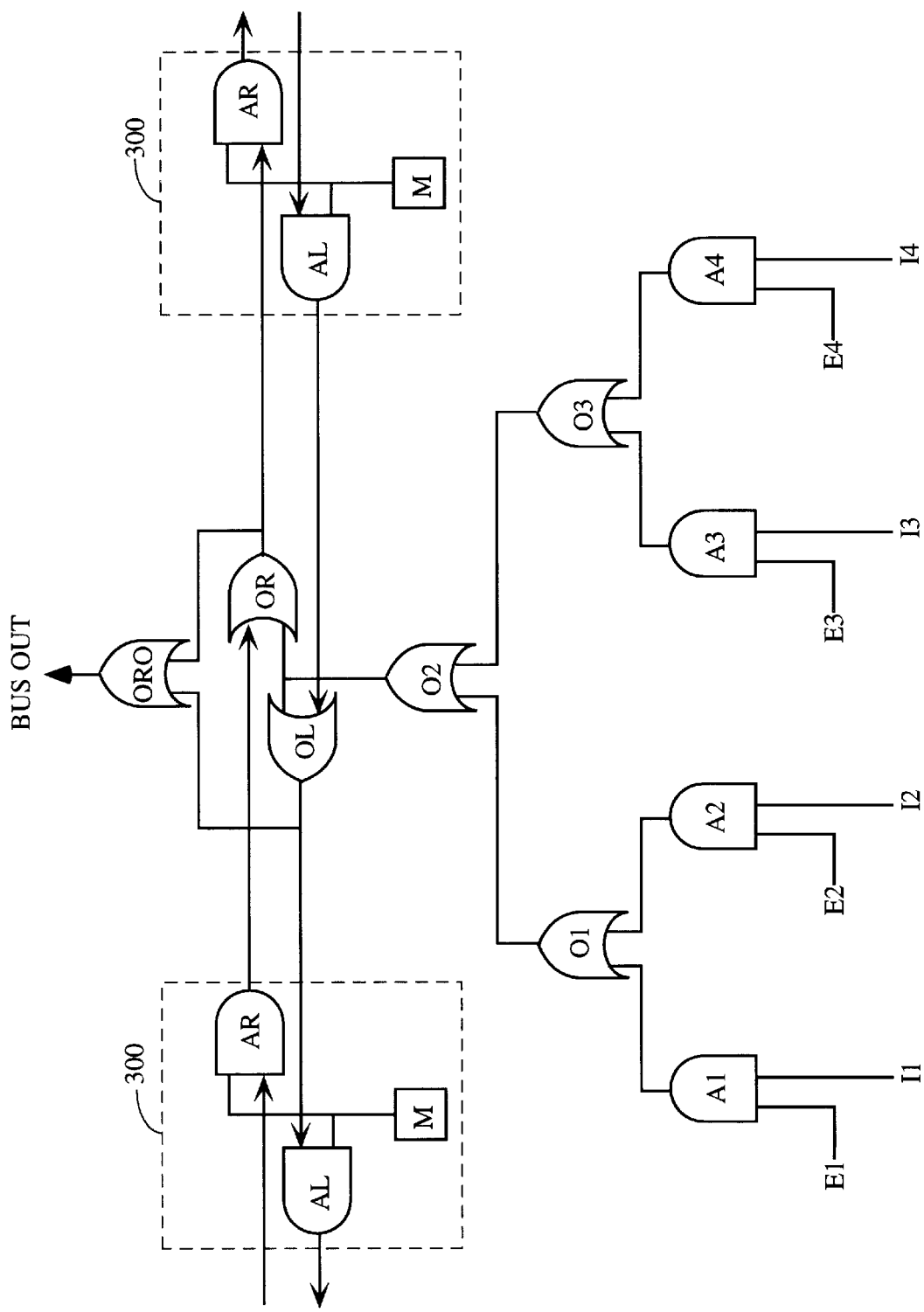

FIGS. 18 and 19 show two embodiments of this aspect of the invention. The bus comprises bus segments 202, 204, and 202' driving to the right and bus segments 203, 205, and 203' driving to the left. The buffers for driving the bus are formed from OR gates OR1 through OR4. The embodiment of FIG. 18 uses a default bus value of logic 1. Thus, if no buffer is enabled to place its input signal on the bus, the value on the bus is logic 1. This can be seen from the following: The enable signals T1 through T4 are set to logic 1 when the corresponding inputs I1 through I4 are not to be enabled. Thus when no OR gates OR1 through OR4 are enabled, the logic 1 outputs cause AND gate AND2 to output logic 1, therefore causing AND gates 196 and 197 to pass the bus signals from input to output. The beginnings of the two bus lines are pulled high by a Vcc connection not shown. Thus all bus segments are logic 1.

If an input signal is enabled, the bus value may be logic 0 or logic 1 depending upon the input signal value. For example, if input signal I1 is logic 0 and enable signal T1 is logic 0, the logic 0 output of OR gate OR1 will cause AND gate AND2 to apply logic 0 to AND gates 196 and 197. Thus bus segments 204 and 202' and other segments to the right of the figure will carry logic 0, while bus segment 202 and other segments to the left remain logic 1. Similarly, bus segments 203 and 205" and other bus segments to the left will carry logic 0 while bus segments 205 and 203' and others to the right will remain logic 1. If input signal I1 is at logic 1 when enable signal T1 is at logic 0, all bus segments will carry logic 1 signals.

The bus lines are segmented at programmable interconnection points (PIPs) 200. An actual structure will typically have many such adjacent segments programmably connected at PIPs. When memory cell M carries logic 1, OR gates 198 and 199 output logic 1 signals. Thus the downstream AND gate carries the value provided by AND gate 195. When memory cell M carries logic 0, OR gates 198 and 199 propagate the signal already on the bus. Thus if another OR gate not shown has placed a logic 0 onto the bus, that logic 0 will be propagated by AND gate 196 or 197.

Figure 17:
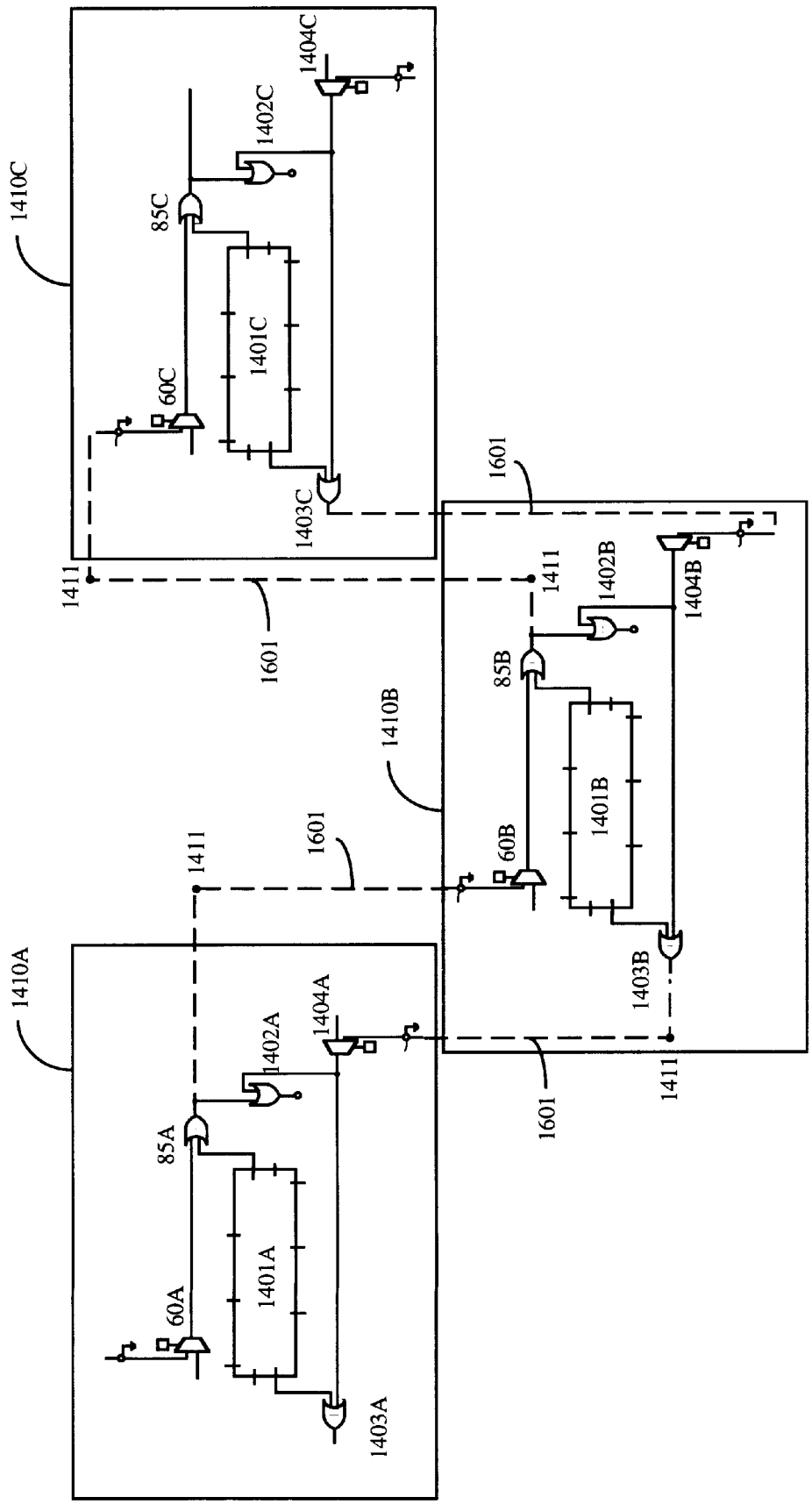
FIG. 17 illustrates a plurality of interconnected bidirectional multiplexer chains on different rows.

The structure of FIG. 18 or 19 has the advantage over that of FIGS. 15–17 that all input signals pass through the same number of logic gates and therefore experience very nearly equal delay in reaching the bus.

The embodiment of FIG. 19 functions in an equivalent manner to that of FIG. 18 but AND gates of FIG. 18 are replaced by OR gates in FIG. 19, and OR gates of FIG. 18 are replaced by AND gates in FIG. 19. In such a structure, the default bus value is logic 0. Programmable interconnection points 300 are formed from AND gates, and therefore a logic 0 in memory cell M causes the bus to be segmented whereas a logic 1 causes the bus to be connected. The input buffers A1 through A4 are AND gates, and are therefore input signals I1 through I4 are enabled by setting signals E1–E4 to logic 1.

Figure 20A:
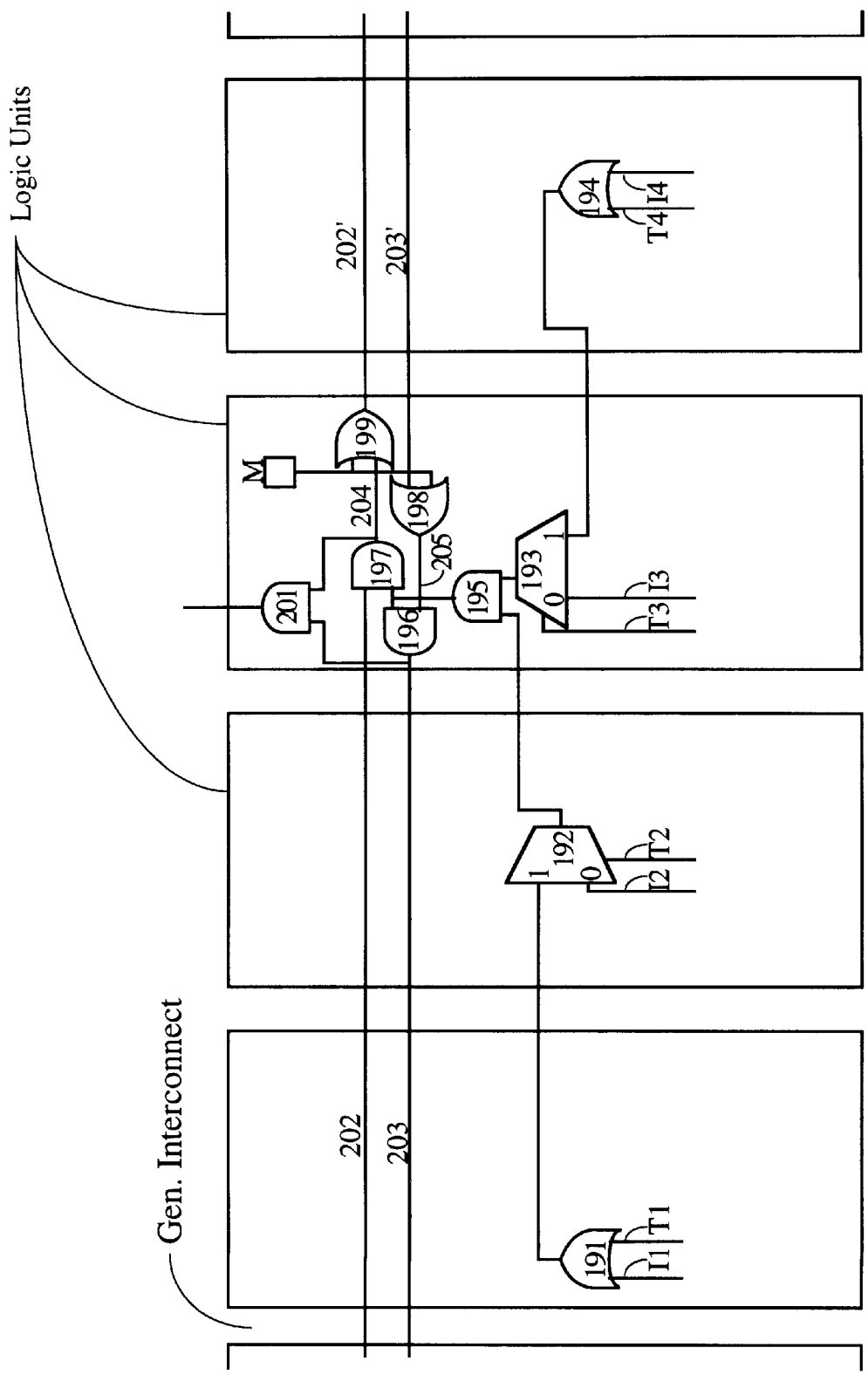
FIG. 20a shows a multiplexer implementation of the structure of FIG. 18.

FIGS. 20a–20d illustrate implementations of the structure of FIG. 18 in an FPGA having adjacent logic units. The structure of FIG. 20a is a multiplexer implementation where the multiplexers of FIG. 20a are logically equivalent to OR and AND gates of FIG. 18 as discussed above (unless an error condition has occurred in which more than one input signal has been enabled). Labels of the multiplexer equivalents are added to FIG. 18 to aid in the comparison.

Figure 20B:
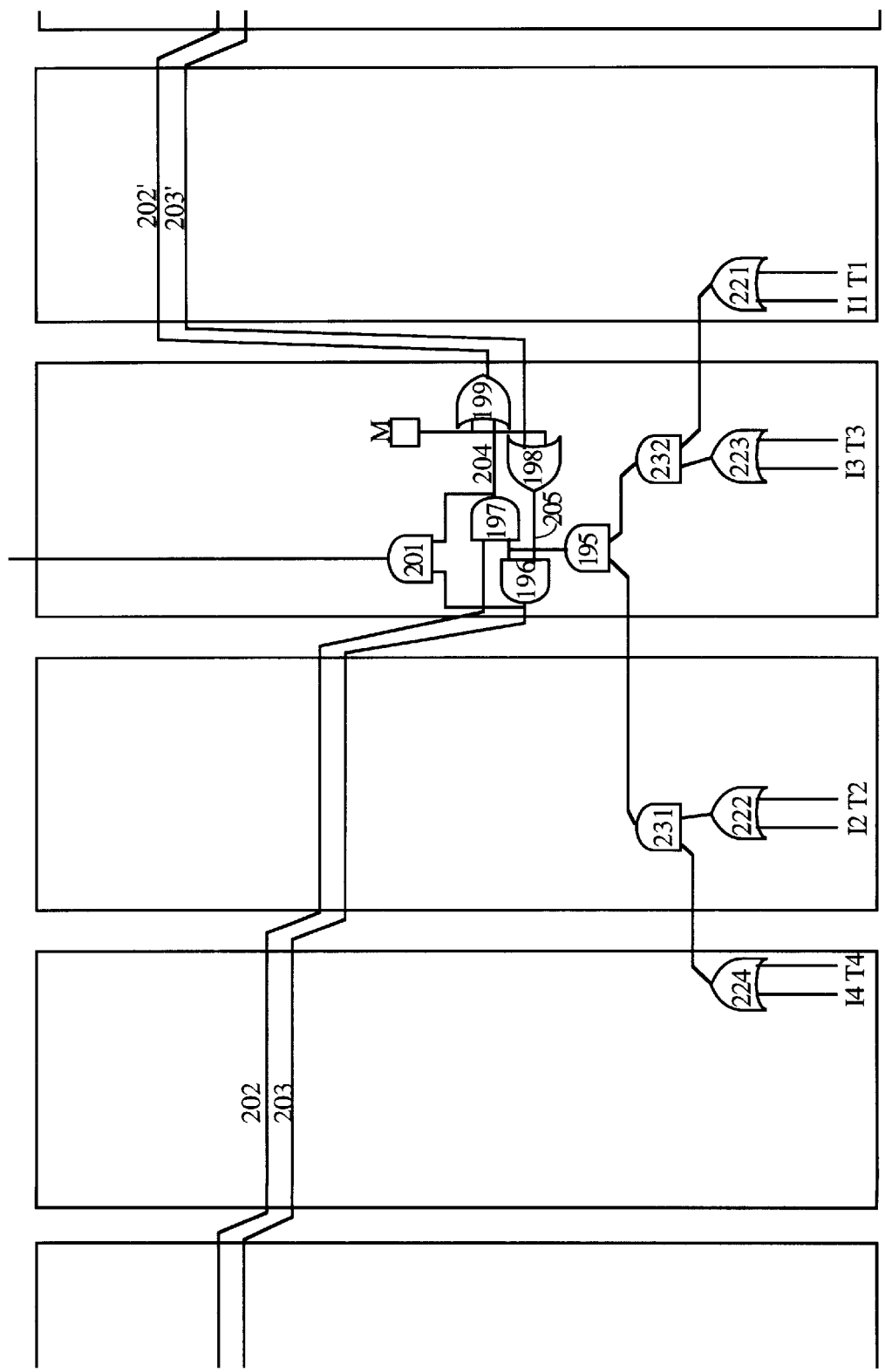
FIG. 20b shows a layout representation of the structure of FIG. 18.

The structure of FIG. 20b shows the circuit of FIG. 18. Components are shown as they are actually placed in adjacent logic units in one embodiment. The particular layout represented by FIG. 20b allows for repeating structures in identical adjacent logic units. In this embodiment, connections to the bus comprising lines 202 and 203 occur every four logic units. Of course other spacings can be used and other numbers of drivers can form part of one tree.

Figure 20C:
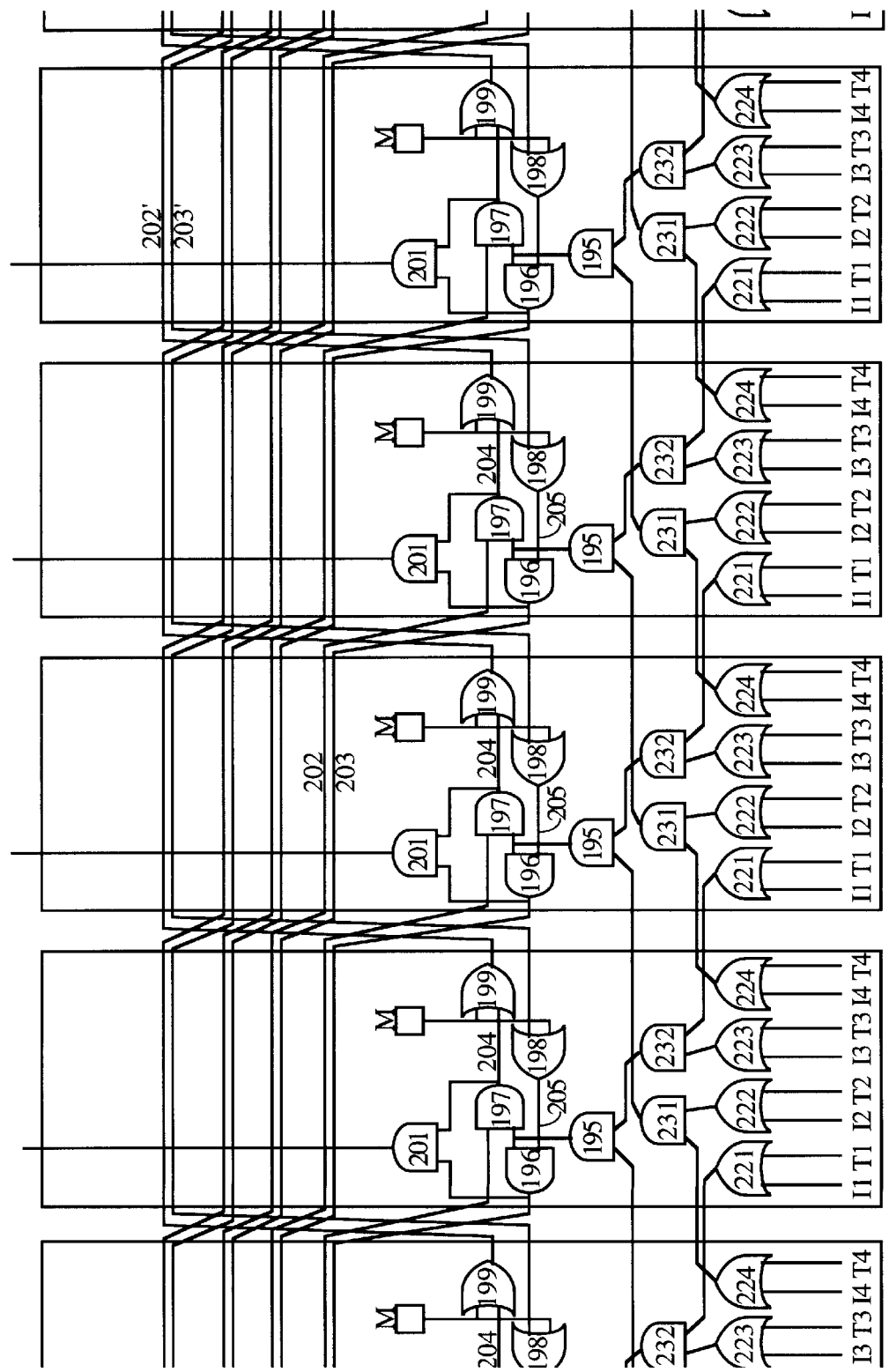
FIG. 20c shows the pattern of identical adjacent logic units implementing the structure of FIG. 20b.

FIG. 20c shows the pattern of identical adjacent logic units implementing the structure of FIG. 20b. Each logic unit includes four OR gates 221–224, and two first level AND gates 231 and 232. Structures 195–199 and 201–205 are as shown and labeled in FIG. 18.

Figure 20D:
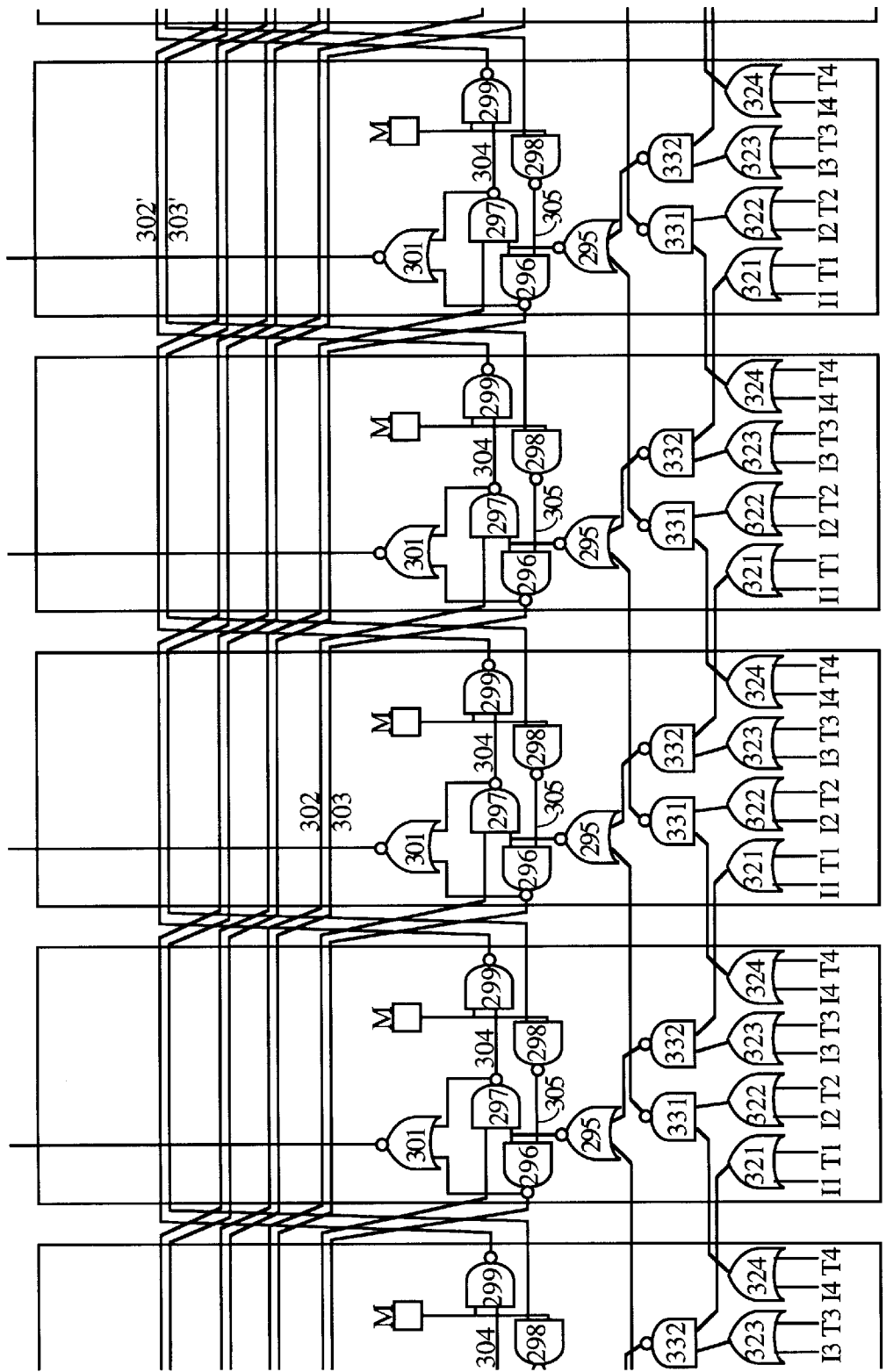
FIG. 20d shows a NAND gate implementation of the structure of FIG. 18.

FIG. 20d shows an OR-NAND-NOR gate implementation having the same logical functions as the structure of FIG. 20c. NAND and NOR gates are often preferred to AND and OR gates because NAND and NOR gates use fewer transistors and have less gate delay. In this embodiment, there are always an even number of logic inversions between an input signal and a tap point at the output of a NOR gate 301. For example, there are four inversions between an input signal I3 and a tap point at the output of NOR gate 301 in the same logic block. There are six inversions between that input signal I3 and the next tap point in the logic block four blocks to the right of the input signal. Other embodiments can use other types of gates and can further include inverters if necessary.

Those skilled in the art will recognize other embodiments within the scope of the present invention as set forth in the following claims.

We claim:

1. A bus structure for an FPGA comprising:

a bus;

a plurality of drivers, each having an input signal and an enable signal;

a tree structure connecting the drivers to the bus such that:
when one driver is enabled by its enable signal, its input signal is placed onto the bus, and
all drivers in the tree structure experience the same number of logic elements between their input signal and the bus.

2. A bus structure as in claim 1 wherein the tree structure is formed of logic gates.

3. A bus structure as in claim 1 wherein the tree structure is formed of multiplexers.

4. A bus structure as in claim 1 wherein the bus is segmented.

5. A bus structure as in claim 4 wherein the segmentation of both directions is controlled by a memory cell.

6. A bus structure as in claim 1 wherein the tree structure places approximately the same delay between each driver and the bus.

7. A bus structure as in claim 1 wherein each the bus line comprises a logic gate for receiving input from an upstream direction of the bus line and from the tree structure and providing an output to the downstream direction of the bus line.

8. A bus structure as in claim 1 wherein the bus is a bidirectional bus comprising two bus lines driven in opposite directions; and when one tristate driver is enabled by its enable signal, its input signal is placed onto the bidirectional bus in both directions.

9. A bus structure as in claim 8 wherein the bidirectional bus comprises bus segments divided by programmable interconnection points (PIPs) each controlled by a memory cell.

10. A bus structure as in claim 9 wherein each PIP comprises a two-input PIP NAND gate for each bus line, each PIP NAND gate receiving one input signal from the memory cell and another input signal from an upstream segment of the bus line, and providing an output signal to a downstream segment of the bus line.

11. A bus structure as in claim 10 wherein the bus further comprises a signal placing NAND gate for each bus line, each signal placing NAND gate receiving one input signal from the tree structure and another input signal from an upstream portion of its bus line and providing an output signal to a downstream portion of its bus line.

12. A bus structure as in claim 11 wherein the tree structure comprises a NOR gate receiving two input signals generated in two adjacent logic blocks, and each of the two input signals is provided by a tree structure NAND gate, and wherein each of the two tree structure NAND gates receives two input signals from an input NOR gate, each of the four input NOR gates being located in different logic blocks.

13. A bus structure as in claim 11 further comprising an output tap logic gate receiving as input signals the output signals from the signal placing NAND gates for the two bus lines, and providing an output signal to an FPGA interconnect structure in which the bus structure is located.

* * * * *